United States Patent
Hofer et al.

(10) Patent No.: US 6,482,566 B1
(45) Date of Patent: Nov. 19, 2002

(54) HYDROXYCARBORANE PHOTORESISTS AND PROCESS FOR USING SAME IN BILAYER THIN FILM IMAGING LITHOGRAPHY

(75) Inventors: Donald C. Hofer, Paso Robles, CA (US); Scott A. MacDonald, San Jose, CA (US); Arpan P. Mahorowala, White Plains, NY (US); Robert D. Miller, San Jose, CA (US); Josef Michl, Boulder, CO (US); Gregory M. Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/507,522

(22) Filed: Feb. 18, 2000

(51) Int. Cl.⁷ ............................. G03C 1/73; G03C 5/16; G03C 5/56
(52) U.S. Cl. ................... 430/270.1; 430/322; 430/323; 430/326; 430/905; 430/910; 430/914
(58) Field of Search ............................. 430/270.1, 910, 430/905, 914, 323, 326, 322

(56) References Cited

U.S. PATENT DOCUMENTS 5,286,599 A * 2/1994 Babich et al. ............ 430/270.1
5,985,524 A * 11/1999 Allen et al. .................. 430/326

OTHER PUBLICATIONS

Zharov et al., Inorganic Chem., 36, No. 26, 6033–6038 (1997).
Kirk & Othmer, Encyclopedia of Chemical Technology, Supplement, Fourth Edition, pp. 233–280.

* cited by examiner

Primary Examiner—Janet Baxter
Assistant Examiner—Sin J. Lee
(74) Attorney, Agent, or Firm—Scully, Scott, Murphy & Presser; Daniel E. Johnson

(57) ABSTRACT

A photoresist composition which includes hydroxycarborane either incorporated as a monomeric dissolution modifier or as pendent groups on a polymer backbone. The photoresist composition is particularly useful in a bilayer thin film imaging lithographic process in which ultraviolet radiation-imaging in a wavelength range of between about 365 nm and about 13 nm is employed.

16 Claims, 2 Drawing Sheets

HYDROXYCARBORANE PHOTORESISTS AND PROCESS FOR USING SAME IN BILAYER THIN FILM IMAGING LITHOGRAPHY

BACKGROUND OF THE INVENTION

1. Field of the Invention

The present invention is directed to a new class of photoresists which include hydroxycarboranes. More specifically, the present invention is directed to a photoresist which includes a hydroxycarborane additive or pendent group on a polymeric backbone.

2. Background of the Prior Art

Advances in the semiconductor arts are driven by many technological developments. Among these are process improvements which allow semiconductor chips to be lithographically patterned in ever smaller geometries. These improvements, in turn, have been accomplished in the past by continually reducing the wavelength of the imaging radiation from the visible light range, i.e. 436 nm, down to the presently employed ultraviolet (UV) range, i.e. 248 to 365 nm. Indeed, present day lithography is predicated on utilizing imaging radiation at a UV wavelength of 193 nm. Future wavelength imaging is contemplated to employ lasers utilizing a UV wavelength of 157 nm. Looking out further into the future, imaging radiation having a wavelength in the extreme UV range of 13 nm has been proposed.

As photoresist transparency decreases to these short wavelengths, accompanied by shrinkage in device geometries to below 100 nm, there is an increased need in the art for thin film imaging approaches to accommodate these reduced wavelengths.

An accepted means for providing thin film imaging is the utilization of photoresists which incorporate silicon in an oxygen-reactive ion etching ($O_2$-RIE) process. Such means employ the bilayer process or the top surface imaging process. Both of these methods rely on differences between oxygen plasma etch rates of polymers that contain elements forming refractory oxides, i.e. silicon oxide, and simple organic polymers comprised only of elements forming volatile oxides.

Although the use of silicon-containing photoresists in this application represent a significant advance in the art, such photoresists suffer from a major deficiency, the improvement of which has been long sought by those skilled in the art. That is, as those skilled in the art are aware, silicon-containing photoresists are not sufficiently acidic to provide optimum removal of exposed portions of the photoresist during the lithographic procedure. Indeed, phenolic materials, which are used in higher wavelength imaging operations, provide a standard upon which other photoresist materials are judged in regard to photoresist removal based on photoresist acidity. However, phenolic-based photoresists are not optically transparent in the UV wavelength range. Thus, phenolic materials are not employed in state of the art thin film UV wavelength range lithographic applications.

It is thus apparent that a new class of photoresists suitable for utilization in $O_2$-RIE thin film imaging lithography represents a pressing need in the art.

Hydroxycarboranes have been described in the art. I. Zharov et al., *Inorganic Chem.* 36, No. 36, 6033–6038 (1997) describes such a class of hydroxycarboranes. That technical article, however, provides no disclosure or suggest of utilizing the compounds described therein as photoresists, let alone disclosing or suggesting photoresists which include a polymeric backbone to which hydroxycarboranes are attached as an additive or pendent group.

BRIEF SUMMARY OF THE INVENTION

It has now been discovered that a new class of photoresists suitable for utilization in $O_2$-RIE provide both excellent transparency in the ultraviolet light wavelength range and excellent processability in thin film imaging lithography in production of semiconductor devices and the like.

In accordance with the present invention a photoresist composition is provided. The photoresist composition includes an acid labile polymer, a hydroxycarborane monomeric dissolution modifier and a photoacid generator. Alternatively, the photoresist composition includes a hydroxycarborane as a pendent group on a polymeric backbone and a photoacid generator.

In further accordance with the present invention a process of bilayer thin-film imaging lithography is provided in which a hydroxycarborane photoresist is utilized.

BRIEF DESCRIPTION OF THE DRAWINGS

The instant invention may be better understood by reference to the accompanying drawings of which.

DETAILED DESCRIPTION

Carboranes are compounds containing one or more carbon atoms incorporated in an electron-delocalized borane framework. Of these compounds, decacarboranes, defined by the formula $C_2B_{10}H12$, constitute particularly useful species. There are three structural isomers, having this formula, the ortho, meta and para isomers, depending upon the positioning of the two carbon atoms of decacarborane. In each structure, the two carbon atoms are each bonded to a hydrogen atom which is rendered acidic by the electron-attracting nature of the boron heterocyclic ring.

The decacarboranes are particularly interesting because they are exceptionally thermally and oxidatively stable. Since the carbon-hydrogen bonds of decacarboranes are relatively acidic, a variety of substituted decacarboranes can be prepared from the carbon anions. Thus, the hydrogen atom bonded to the carbon atom of hydroxy-substituted decacarboranes is substitutable with a functional group. Because of the strong electron-attracting nature of the carborane nucleus, hydroxy-substituted decacarboranes thus constitute a functional equivalent of phenol.

Figure 1A:
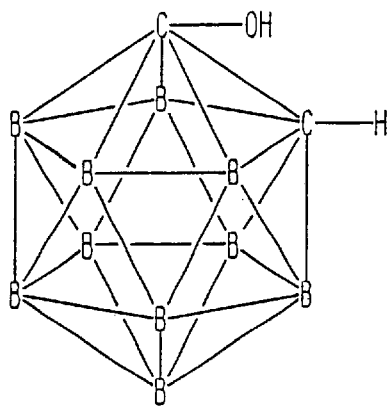
FIGS. 1(a) to 1(c) depict structural isomers of hydroxy-decacarboranes.
Figure 1B:
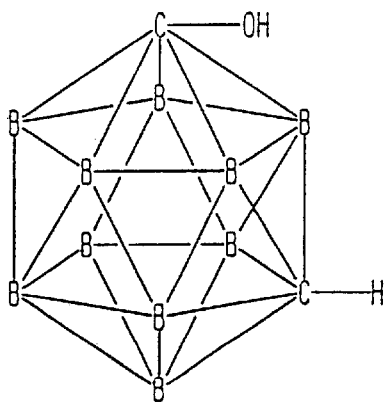
Figure 1C:
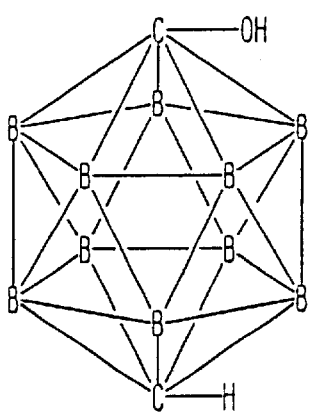

The three above discussed hydroxy-substituted decacarboranes are illustrated in FIGS. 1(a)–1(c). FIG. 1(a) depicts the ortho isomer, FIG. 1(b) the meta isomer and FIG. 1(c) the para isomer. Each of these hydroxy-substituted decacarboranes are prepared from the corresponding decacarborane.

The pKa values of ortho-hydroxydecacarborane, meta-hydroxydecacarborane and para-hydroxydecacarborane are 5.33, 8.39 and 9.03, respectively. Therefore, the acidity of these compounds is comparable to phenolic derivatives. Although comparative to phenolics in terms of acidity, the hydroxydecacarboranes have significantly different chemical and physical characteristics. Whereas phenols are not oxidatively stable, the hydroxydecacarboranes are oxidatively stable. Moreover, hydroxydecacarboranes are optically transparent since they do not demonstrate significant optical absorption into the vacuum UV spectral region. Phenolics are not optically transparent in this wavelength range.

The hydroxydecacarboranes thus constitute an inorganic, optically transparent analog of the organic, optically opaque phenols. Since excessive optical absorption, particularly at short wavelengths, constitute a barrier to utilization of phenols in lithographic processes, the hydroxycarboranes provide a novel alternative in lithographic processes, especially in the UV wavelength range.

It is emphasized that protection of the hydroxy functionality with acid labile groups provides a hydrophobic entity that can be rendered hydrophilic and acidic using classical photoacid generators useful in chemical amplification lithography. Such a protection-deprotection scheme results in materials which are soluble in aqueous basic photoresist developers.

Among the hydroxy-functional protecting groups that may be employed to protect the hydroxy group bonded to the ring carbon of hydroxycarboranes are trialkylsilyl groups, e.g. trimethylsilyl, methoxyethylmethyl groups, and tert-butoxycarbonyl groups. These groups are added by substitution reactions, well known in the art, that add these protecting groups to the hydroxycarborane molecule.

It is particularly important to emphasize that the presence of an acidic carbon-hydrogen bond on the non-hydroxy-substituted carbon atom provides the opportunity to provide additional functionality, i.e. a group containing, for example, a reactive hydroxy radical. The addition of this group to the hydroxycarborane protected molecule provides a site for copolymerization.

Two preferred embodiments of photoresists containing hydroxycarboranes may be employed in the present invention. The first hydroxycarborane photoresist embodiment utilizes the hydroxycarborane as a monomeric dissolution modifier. In this embodiment a hydroxycarborane is added to an acid labile protecting polymer. A particularly preferred acid labile protecting polymer is an acrylate, a methacrylate or a styrene polymer provided with an acid labile protecting group.

For example, a copolymer of methyl methacrylate and tert-butyl acrylate (TBA) or a copolymer of methyl methacrylate and tert-butyl methacrylate (TBMA) represent particularly preferred examples of acid-labile protected polymers useful in the photoresist of the present invention. Those skilled in the art will appreciate that the TBA or TBMA group is itself hydrophobic but upon exposure to acid the t-butyl portion is cleaved and is thus converted to carboxylic acid which, of course, is soluble in aqueous base. Those skilled in the art will recognize other such acid labile groups of which t-butyl acrylate is but one preferred member.

In another preferred embodiment of the acid labile protecting polymer, a third comonomer, which aids in controlling dissolution properties, is included. In that preferred embodiment, a preferred third comonomer is acrylic acid. Not only does the inclusion of the third comonomer aid in controlling dissolution prior to exposure to radiation but, indeed, that third comonomer becomes an accelerant subsequent to radiation exposure.

The hydroxycarborane monomer with which the acid labile protected polymer is combined in this embodiment may or may not itself include a hydroxyl group protecting group. If protected, the aforementioned trialkylsilyl, methoxyethylmethyl or tertiarybutoxycarbonyl groups are preferably utilized.

The first embodiment of the photoresist of the present invention includes, as a third component, a photoacid generator (PAG). A PAG is a chemical agent which, upon exposure to irradiation, generates acid. The PAG breaks down the acid labile protecting group. PAGs within the scope of the present invention include nitrobenzyl compounds, onium salts, sulfonates, carboxylates and the like. Of these, onium salts are particularly preferred. Thus, triarylsulfonium salts and diaryliodium salts are often employed as the PAG in the present invention.

In a second preferred embodiment the hydroxycarborane photoresist is provided as a pendent group on a polymeric backbone. The hydroxycarborane polymer includes a copolymer of a hydroxycarborane comonomer wherein the hydroxy group is protected with an acid labile protecting group wherein the acid labile protecting group is again preferably provided by a trialkylsilyl groups such as trimethylsilyl (TMS), a methoxyethylmethyl group (MEM) or a tertiary butoxycarbonyl group (TBOC). The second carbon atom of the hydroxycarborane is bonded to a functional group, such as hydroxypropyl, which can react with a coupling reagent. The coupling reagent is a polymerizable comonomer. In a preferred embodiment, the polymerizable comonomer is acrylic acid or methacrylic acid.

The copolymer of the hydroxycarborane comonomer and polymerizable comonomer may, optionally, include a third comonomer to provide yet an additional acid labile protecting group such as tert-butyl acrylate or the like.

The photoresist composition which includes a hydroxycarborane as a pendent group on a polymeric backbone is provided with a PAG. The PAG introduced into the second photoresist composition is identical to the PAG provided in the first embodiment of the photoresist composition of the present invention.

The compounds depicted in FIGS. 1(a)–1(c), employed in the photoresist composition of the present invention, offer a number of advantages over current generation materials in lithographic applications. Because of their very high boron density, photoresists containing hydroxycarboranes can be formed into very thin imaging layers which, in spite of the thinness of the layer, have high etch resistance in oxygen plasmas. As such, they are particularly useful in bilayer oxygen reaction ion etching. In addition, as stated earlier, the hydroxycarboranes have pKa values nearly identical to the phenolic materials used in higher wavelength photoresists. The pKa values of phenolics, which are very similar to the pKa values of hydroxycarboranes, represents a major reason for their preferred use in this application.

Finally, hydroxycarboranes demonstrate excellent optical transparency at the ultraviolet wavelength of 193 nm and good transparency at the extreme ultraviolet wavelength at 13 nm. Although the state of the art has not reached the point of utilizing extreme ultraviolet lithography, it is expected that these hydroxycarborane photoresists will exhibit good optical characteristics at as low a wavelength as 13 nm. This is a reasonable expectation given the low atomic number of boron. Thus, the photoresist of the present invention is generally useful in the UV wavelength range of about 365 nm to about 248 nm but especially in the range of between about 193 nm and about 13 nm.

For the reasons given above, the hydroxycarborane photoresist composition of the present invention are employable in thin film imaging lithography. For example, they are particularly useful in bilayer processing.

A positive tone imaging layer thin film bilayer process is depicted in the illustrations of FIG. 2. FIG. 2(a) depicts an article 10, which will ultimately be a semiconductor device. That article 10 includes a thin imaging layer 3 containing a hydroxycarborane photoresist of the present invention disposed above a thick layer etch resistant layer 2. The layer 2, in turn, is disposed upon a substrate 1.

The thus prepared article 10 is thereupon exposed to a source of ultraviolet radiation (UV) denoted by arrow 5. However, the UV that reaches the surface of the thin layer 3 is defined by a mask 4. Thus, in the imaging step of FIG. 2(b) only those areas of layer 3 defined by reference numeral 6 are exposed to the UV 5. The developing step, illustrated by FIG. 2(c), results in the removal of the portions 6' of the layer 3 in accordance with lithographic principles well known in the art. Thus the layer 3 is devoid of removed portions, as depicted at 6'.

Figure 2A:
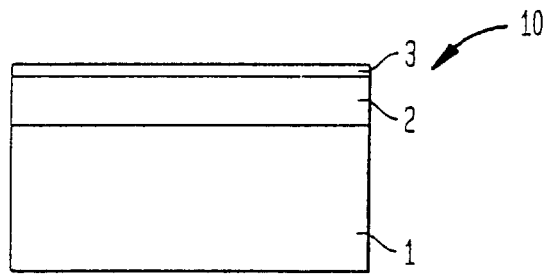
FIGS. 2(a) to 2(d) illustrates steps in the formation of a semiconductor device utilizing a hydroxycarborane photoresist in a thin film bilayer lithographic process.
Figure 2B:
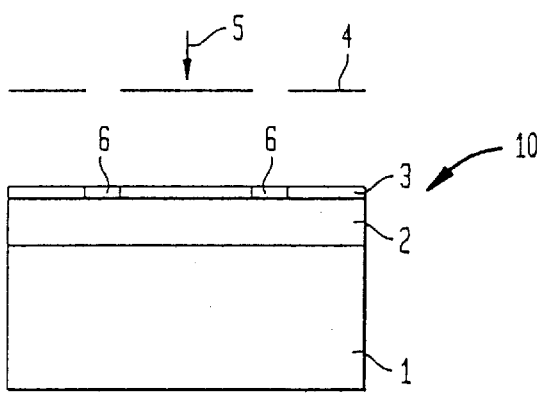
Figure 2C:
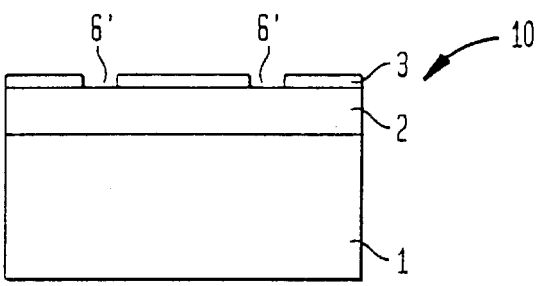
Figure 2D:
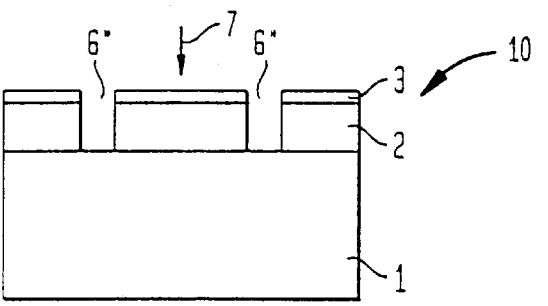

The article 10 is next subjected to oxygen reactive ion etching ($O_2$-RIE) in which the layer 3 containing the photoresist of the present invention acts as a barrier thereto. This is illustrated in FIG. 2(d) where an $O_2$-RIE stream, depicted by arrow 7, is focused upon the layer 3. This results in the removal of the portions of layer 2 not protected by layer 3. Thus the devoid portions 6' of the layer 3 is extended to the thick layer etch resistant layer 2 and is shown in FIG. 2(d) as devoid portions 6".

It should be appreciated that this process is identical to lithographic processes in which silicon-containing bilayer photoresists were employed. However, the improved result obtained by the use of the hydroxycarboranes of the present invention is that hydroxycarborane photoresists are soluble in aqueous base. This chemical characteristic, unlike the silicon-containing photoresists of the prior art which do not possess this property, does not disturb the imaging performance of hydroxycarborane photoresist systems.

The following examples are given to illustrate the scope of the present invention. Because these examples are given for illustrative purposes only, the present invention should not be deemed limited thereto.

EXAMPLE 1

Synthesis of 1-Hydroxy-1,2-dicarba-closo-dodecaborane

A solution of o-carborane in tetrahydrofuran (THF) is formed in a vessel under a nitrogen atmosphere and cooled to −78° C. n-Butyllithium is added thereto. The mixture is stirred for 1 hour and thereupon allowed to warm to room temperature. The mixture is stirred for 3 additional hours at which time bis(trimethylsilyl)peroxide is slowly added at a temperature of −30° C. The mixture is warmed to room temperature and is stirred for 12 hours. Pentane is added and after the mixture is washed with ammonium chloride solution, the solvent is removed at reduced pressure. The mixture is eluted with dichloromethane. The product of this procedure is 1-(trimethylsiloxy)-o-carborane.

The 1-(trimethylsiloxy)-o-carborane is dissolved in a mixture of methanol and hydrochloric acid and the solution stirred for 24 hours at room temperature. The mixture is diluted with water and extracted with ether. The ethereal layer is treated with an aqueous sodium hydroxide solution and the alkaline layer is separated from the mixture, neutralized with dilute hydrochloric acid and extracted with hexane. The hexane layer is dried over anhydrous magnesium sulfate and the solvent removed. The resultant white solid is 1-hydroxy-1,2-dicarba-closo-dodecaborane. This compound is more commonly referred to as 1-hydroxy-o-carborane.

EXAMPLE 2

Synthesis of 1-Hydroxy-1,7-dicarba-closo-dodecaborane

The procedure set forth in Example 1 is repeated but for the replacement of o-carborane with m-carborane resulting in the synthesis of 1-hydroxy-1,7-dicarba-closo-dodecaborane, more commonly referred to as 1-hydroxy-m-carborane.

EXAMPLE 3

Synthesis of 1-Hydroxy-1,12-dicarba-closo-dodecaborane

The procedure set forth in Example 1 is repeated but for the replacement of o-carborane with p-carborane resulting in the synthesis of 1-hydroxy-1,12-dicarba-closo-dodecaborane, more commonly referred to as 1-hydroxy-p-carborane.

EXAMPLE 4

Synthesis of 1-Ethoxymethoxy-2-allyl-1,2-dicarba-closo-dodecaborane

The product of Example 1, using its more commonly used name, 1-hydroxy-o-carborane, is dissolved in THF under a nitrogen atmosphere at room temperature. Sodium hydride is added under a nitrogen atmosphere and stirred until gas evolution stops and the sodium hydride disappears. Chloromethyl ethyl ether is added to the solution producing a precipitate. The mixture is stirred for 3 hours to permit complete sodium chloride precipitation. The resultant clear solution is transferred to another vessel under nitrogen and cooled to −78° C. n-Butyllithium is added and the mixture stirred for 1 hour, allowed to warm to room temperature and stirred for an additional 3 hours. Allyl iodide is added and the mixture is stirred for 12 hours. Pressure is reduced to remove the solvent and the crude product purified on a silica gel column with hexane-dichloromethane as an eluent to produce 1-ethoxymethoxy-2-allyl-1,2-dicarba-closo-dodecaborane.

EXAMPLE 5

Synthesis of 1-hydroxy-2-(3-hydroxypropyl)-1,2-dicarga-closo-dodecaborane

The product of Example 4,1-ethoxymethoxy-2-allyl-1,2-dicarba-closo-dodecaborane, is placed in a vessel and is dissolved in THF at room temperature. 9-Borobicyclooctane (9-BBN) is added and the mixture is refluxed for 1 hour. An aqueous sodium hydroxide solution is added followed by the addition of an aqueous hydrogen peroxide solution. The mixture is stirred for 1 hour and the solvent is removed under reduced pressure. A mixture of methanol and hydrochloric acid is added. The mixture is stirred for 24 hours at room temperature, diluted with water and extracted with ether. The ethereal layer is treated with an aqueous sodium hydroxide solution and is separated from the mixture. The alkaline layer is treated with dilute hydrochloric acid and extracted with hexane. The hexane layer is dried over anhydrous magnesium sulfate and the solvent is removed to yield 1-2-(3-hydroxypropyl)-1,2-dicarba-closo-dodecaborane as a white solid.

EXAMPLES 6

Synthesis of a Polymethylmethacrylate Having Pendent o-Carborane Groups

Methyl methacrylate is combined with t-butyl acrylate and 1-hydroxy-2-(3-hydroxypropyl)-1,2-dicarba-closododecaborane, formed in accordance with the procedure of Example 5. The three monomers are polymerized in accordance with standard procedures. The resultant polymer is combined with triphenylsulfonium triflate to form a photoresist composition.

EXAMPLE 7

Testing of Carborane Ion Etch Resistance

To determine the etch resistance of carborane compounds to oxygen reactive ion etching, ortho-carborane was combined with poly(methyl methacrylate) (PMMA) in a concentration such that o-carborane constituted 6% by weight, based on the total weight of PMMA and o-carborane.

The thus formed composition was disposed on a substrate in a standard thickness and was subjected to oxygen reactive ion etching, at a dosage optimized for prior art silicon photoresists, for 150 seconds. The thickness of the PMMA-o-carborane layer was measured after subjection to this etching and was found to have suffered a 710 Angstrom thickness loss.

This loss is consistent with the thickness loss lost by silicon-based photoresists when subjected to the same radiation for the same time duration. However, standard silicon photoresists are present in a concentration of about 10 wt. %.

The above embodiments and examples are given to illustrate the scope and spirit of the present invention. These embodiments and examples will make apparent, to those skilled in the art, other embodiments and examples. These other embodiments and examples are within the contemplation of the present invention. Therefore, the present invention should be limited only by the appended claims.

What is claimed is:

1. A photoresist composition comprising an acid labile polymer, a hydroxycarborane selected from the group consisting of 1-hydroxy-o-carborane, 1-hydroxy-m-carborane and 1-hydroxy-p-carborane and a photoacid generator.

2. A photoresist composition in accordance with claim 1 wherein said hydroxycarborane is 1-hydroxy-o-carborane.

3. A photoresist composition in accordance with claim 1 wherein said hydroxycarborane is 1-hydroxy-m-carborane.

4. A photoresist composition in accordance with claim 1 wherein said hydroxycarborane is 1-hydroxy-p-carborane.

5. A photoresist composition in accordance with claim 1 wherein said acid labile polymer includes an acrylate, a methacrylate or a styrene polymer provided with an acid labile protecting group.

6. A photoresist composition in accordance with claim 5 wherein said acid labile polymer is a copolymer of methyl methacrylate and tertiary butyl acrylate.

7. A photoresist composition in accordance with claim 1 wherein said hydroxycarborane includes a hydroxy-functional protecting group.

8. A photoresist composition comprising a hydroxycarborane selected from the group consisting of 1-hydroxy-o-carborane, 1-hydroxy-m-carborane and 1-hydroxy-p-carborane as a pendent group on a polymeric backbone and a photoacid generator.

9. A photoresist composition in accordance with claim 8 wherein said hydroxycarborane polymer comprises a copolymer of said hydroxycarborane, wherein said hydroxy group of said hydroxycarborane is protected with an acid labile protecting group and a second carbon atom is bonded to a functional group, and a polymerizable monomer.

10. A photoresist composition in accordance with claim 8 wherein said hydroxycarborane is 1-hydroxy-o-carborane.

11. A photoresist composition in accordance with claim 8 wherein said hydroxycarborane is 1-hydroxy-m-carborane.

12. A photoresist composition in accordance with claim 8 wherein said hydroxycarborane is 1-hydroxy-p-carborane.

13. A bilayer thin film imaging lithographic process comprising exposing a bilayer photoresist, the top layer of which is said photoresist composition of claim 1, to ultraviolet radiation whereby images are formed on said top layer; and exposing said images to oxygen reactive ion etching wherein said images are developed in a bottom thick etch resistant photoresist layer.

14. A process in accordance with claim 13 wherein said ultraviolet radiation is in a wavelength range of between about 365 nm and about 248 nm or between about 193 nm and about 13 nm.

15. A bilayer thin film imaging lithographic process comprising exposing a bilayer photoresist, the top layer of which is said photoresist composition of claim 8, to ultraviolet radiation whereby images are formed on said top layer; and exposing said images to oxygen reactive ion etching wherein said images are developed in a bottom thick etch resistant photoresist layer.

16. A process in accordance with claim 15 wherein said ultraviolet radiation is in a wavelength range of between about 365 nm and about 248 nm or between about 193 nm and about 13 nm.

* * * * *

UNITED STATES PATENT AND TRADEMARK OFFICE
CERTIFICATE OF CORRECTION

PATENT NO. : 6,482,566 B1
DATED : November 19, 2002
INVENTOR(S) : Donald C. Hofer et al.

It is certified that error appears in the above-identified patent and that said Letters Patent is hereby corrected as shown below:

<u>Title page,</u>
Item [73], Assignee, insert the following:
-- University Technology Corporation, Boulder, CO. --

Signed and Sealed this

Thirteenth Day of April, 2004

JON W. DUDAS
*Acting Director of the United States Patent and Trademark Office*